United States Patent
Höfig et al.

(10) Patent No.: US 10,359,773 B2
(45) Date of Patent: Jul. 23, 2019

(54) SAFETY ASSURANCE USING FAULT TREES FOR IDENTIFYING DORMANT SYSTEM FAILURE STATES

(71) Applicant: Siemens Aktiengesellschaft, München (DE)

(72) Inventors: Kai Höfig, München (DE); Jean-Pascal Schwinn, München (DE); Marc Zeller, München (DE)

(73) Assignee: SIEMENS AKTIENGESELSCHAFT (DE)

( * ) Notice: Subject to any disclaimer, the term of this patent is extended or adjusted under 35 U.S.C. 154(b) by 0 days.

(21) Appl. No.: 15/915,120

(22) Filed: Mar. 8, 2018

(65) Prior Publication Data

US 2018/0356810 A1 Dec. 13, 2018

(30) Foreign Application Priority Data

Jun. 12, 2017 (EP) .................................... 17175479

(51) Int. Cl.
*G05B 23/02* (2006.01)
*G06F 17/50* (2006.01)
*G06F 3/06* (2006.01)

(52) U.S. Cl.
CPC .......... *G05B 23/0248* (2013.01); *G06F 17/50* (2013.01)

(58) Field of Classification Search
CPC ...... G05B 23/0248; G06F 3/061; G06F 17/50
USPC .......................................................... 700/79
See application file for complete search history.

(56) References Cited

U.S. PATENT DOCUMENTS

| | | | | |
|---|---|---|---|---|
| 6,226,760 B1 * | 5/2001 | Burkhardt | ................ | G07C 3/08 703/14 |
| 2002/0166082 A1 | 11/2002 | Jacobson | | |
| 2012/0232743 A1 * | 9/2012 | Singh | ..................... | G06Q 10/20 701/29.9 |

(Continued)

FOREIGN PATENT DOCUMENTS

| | | |
|---|---|---|
| DE | 102015213581 A1 | 1/2017 |
| EP | 2876519 A2 | 5/2015 |

(Continued)

OTHER PUBLICATIONS

Möhrle Felix et al: "Automating compositional safety analysis using a failure type taxonomy for Component Fault Trees", Risk, Reliability and Safety: Innovating Theory and Practice: Proceedings of ESREL 2016 (Glasgow, Scotland, Sep. 25-29, 2016), pp. 1380-1387, XP055373867, DOI: 10.1201 /9781315374987-207, ISBN: 978-1-138-02997-2, retrieved on May 17, 2017 from the Internet: URL:https://www.researchgate.net/profile/Felix_Moehrle/publication/308903233_Automating_Compositional - s.Recherchenbericht; 2016.

(Continued)

*Primary Examiner* — Michael J Brown
(74) *Attorney, Agent, or Firm* — Schmeiser, Olsen & Watts, LLP (57) ABSTRACT

Techniques of safety assurance using fault trees for identifying dormant system failure states are provided. Both operational failure events, as well as diagnostic failure events are included in a fault tree and the operational failure events are then correlated with the diagnostic failure events, which enables an identification of the dormant system failure states. A component fault tree can be used.

11 Claims, 6 Drawing Sheets

(56) References Cited

U.S. PATENT DOCUMENTS

2015/0067400 A1 3/2015 Ishii
2017/0177424 A1* 6/2017 Guay .................. G06F 11/008

FOREIGN PATENT DOCUMENTS

| WO | 2011148891 A1 | 12/2011 |
| WO | WO 2015151014 A1 | 10/2015 |

OTHER PUBLICATIONS

Vesely, William E., et al. FT handbook. No. NUREG-0492. Nuclear Regulatory Commission Washington DC, 1981; section VII-15, 4 "Determining the Minimal Cut Sets or Minimal Paths Sets of a FT".
Functional safety of electrical/electronic/programmable electronic safety-related systems; IEC 61508 / Functional safety of electrical/electronic/programmable electronic safety-related systems.
Yang Zong-Xiao et al: "Fuzzy fault diagnostic system based on fault tree analysis", Fuzzy Systems, 1995. International Joint Conference of the Fourth IEEE International Conference on Fuzzy Systems and the Second International Fuzzy Engineering Symposium., Proceedings of 1995 IEEE International Conference on Yokohama, Japan 20-24 MA, vol. 1, pp. 165-170, XP010143632, DOI: 10.1109/FUZZY.1995.409676, ISBN: 978-0-7803-2461-9, section 3; 1995.
International Standard ISO 14224 (Dec. 15, 2006); section C.6.
Vesely W E et al: "Fault Tree Handbook" US Nuclear Regulatory Commission (1981), NUREG-0492, Jan. 1981; 1981.
Zeller Marc et al: INSiDER: "Incorporation of system and safety analysis models using a dedicated reference model." 2016 Annual Reliability and Maintainability Symposium (RAMS) (2016) pp. 1-6; 2016.
Kaiser et al. "A New Component Concept for Fault Trees"; At the 8th Australian Workshop on Safety Critical Systems and Software, vol. 33, 2003 (pp. 37-46).
IEC 60812 "Analysis Techniques for System Reliability—Procedure for Failure Mode and Effects Analysis (FMEA)", 1991.
EESR dated Nov. 24, 2017, Application No. 17175479.9.
Korean Notice of Allowance dated Jan. 3, 2019 for Application No. 10-2018-0067558.

* cited by examiner

FIG 6

SAFETY ASSURANCE USING FAULT TREES FOR IDENTIFYING DORMANT SYSTEM FAILURE STATES

CROSS-REFERENCE TO RELATED APPLICATION

This application claims priority to European Application No. 17175479.9 having a filing date of Jun. 12, 2017, the entire contents of which are hereby incorporated by reference.

FIELD OF TECHNOLOGY

Various examples of the following generally relate to modeling a multi-component control or actuator system using a fault tree, e.g., a component fault tree. Various examples of the invention specifically relate to correlating operational failure events with diagnostic failure events of the fault tree for identifying dormant system failure states.

BACKGROUND

The importance of safety-critical systems in many application domains of embedded systems, such as aerospace, railway, health care, automotive and industrial automation is continuously growing. Thus, along with the growing system complexity, also the need for safety assurance as well as its effort is increasing in order to guarantee the high quality demands in these application domains. The aim of safety assurance is to ensure that systems do not lead to hazardous situations which may harm people or endanger the environment. In the application domains of safety-critical systems, the safety assurance is defined by the means of standards, see, e.g. the International Electrotechnical Commission (IEC) 61508 "Functional safety of electrical/electronic/programmable electronic safety related systems" (1998).

Traditionally, the assessment of a system in terms of safety is based on a bottom-up safety analysis approach, such as Failure Mode and Effect Analysis (FMEA), see IEC 60812 "Analysis Techniques for System Reliability—Procedure for Failure Mode and Effects Analysis (FMEA)" (1991). Alternatively, the assessment of a system according to reference implementations is based on top-down approaches such as the Fault Tree Analysis (FTA), see, e.g Vesely, W. E., Goldberg, F. F., Roberts, N. H., Haasl, D. F.: Fault Tree Handbook. US Nuclear Regulatory Commission (1981). By such techniques, it is possible to identify system failure states, their causes, and effects with impact on the system safety.

However, in such approaches it can be difficult to identify dormant system failure states. A dormant system failure state (sometimes also referred to as hidden system failure state) corresponds to a failure of the system—i.e., of one or more components of the system—that requires specific diagnostic actions to be identified. The dormant system failure state is a failure that is not immediately evident to operations and maintenance personnel. Dormant system failure states are, e.g., described in International Standard ISO 14224 (Dec. 15, 2006); section C.6.

For example, in reference implementations, dormant system failure states are typically identified manually based on information on the system design, e.g., circuit diagrams of a rolling stock. However, such reference implementations face certain restrictions and drawbacks. Since the complexity of today's systems is continuously growing, the effort required to identify the dormant system failure states is increasing drastically. Furthermore, manually identifying dormant system failure states can be error-prone. Furthermore, diagnostic measures to mitigate the dormant system failure states are typically required to be specified manually, which is also error-prone and may require significant efforts.

WO 2015/151014 A1 discloses a fault tree analysis tool that can access one or more tree structures. Each tree structure may be a fault tree associated with, for example, a control system or subsystem of an aircraft. The fault tree analysis tool can output one or more lists based on the tree structures. The lists can include event lists that define events and probabilities of each of the events for the tree structure. Risk calculations may be performed.

US 2012/166082 discloses a system and method for diagnosing one or more faults or one or more potential faults in a machine. An expert system module having a fault tree is guided through only a truncated portion of the fault tree based upon output from a fold recognition module.

US 2015/067400 A1 discloses a system that discards unneeded elements when generating a fault tree of an object to be analyzed. Configuration information identifies a plurality of functional blocks comprised by the object and a plurality of signal lines that connect the functional blocks and logical relationships. Exclusion target information identifies a signal line that may be excluded from the plurality of signal lines without loss of information.

Yang, Zong-Xiao, et al. "Fuzzy fault diagnostic system based on fault tree analysis." Fuzzy Systems, 1995. International Joint Conference of the Fourth IEEE International Conference on Fuzzy Systems and The Second International Fuzzy Engineering Symposium., Proceedings of 1995 IEEE Int. Vol. 1. IEEE, 1995. discloses a method for process fault diagnosis using information from fault tree analysis and uncertainties/imprecision of data. Fault tree analysis provides a procedure for identifying failures within a process.

Therefore, a need exists for advanced techniques of analyzing safety-critical systems. In particular, a need exists for techniques which facilitate identifying dormant system failure states.

SUMMARY

A computer-implemented method includes modeling a multi-component control or actuator system using a component fault tree (CFT). The CFT includes a plurality of elements associated with components of the system. The CFT further includes a plurality of interconnections between the elements of the plurality of elements. The interconnections are associated with functional dependencies between the components of the system. The method further includes assigning, to at least some of the elements, operational failure events which are associated with malfunctioning of the respective component of the system. The method further includes assigning, to at least some of the elements, diagnostic failure events associated with malfunctioning of a diagnostic measure associated with the respective component of the system. The method further includes correlating the operational failure events with the diagnostic failure events and, depending on said correlating of the operational failure events with the diagnostic failure events, identifying dormant system failure states and non-dormant system failure states of a plurality of failure states of the system.

A device includes at least one processor. The at least one processor is configured to execute a method. The method includes modeling a multi-component control or actuator system using a CFT. The CFT includes a plurality of elements associated with components of the system. The CFT further includes a plurality of interconnections between the elements of the plurality of elements. The interconnections are associated with functional dependencies between the components of the system. The method further includes assigning, to at least some of the elements, operational failure events which are associated with malfunctioning of the respective component of the system. The method further includes assigning, to at least some of the elements, diagnostic failure events associated with malfunctioning of a diagnostic measure associated with the respective component of the system. The method further includes correlating the operational failure events with the diagnostic failure events and, depending on said correlating of the operational failure events with the diagnostic failure events, identifying dormant system failure states and non-dormant system failure states of a plurality of failure states of the system.

A computer program product (non-transitory computer readable storage medium having instructions, which when executed by a processor, perform actions) includes program code which may be executed by at least one processor. Executing the program code by the at least one processor may cause the at least one processor to perform a method. The method includes modeling a multi-component control or actuator system using a CFT. The CFT includes a plurality of elements associated with components of the system. The CFT further includes a plurality of interconnections between the elements of the plurality of elements. The interconnections are associated with functional dependencies between the components of the system. The method further includes assigning, to at least some of the elements, operational failure events which are associated with malfunctioning of the respective component of the system. The method further includes assigning, to at least some of the elements, diagnostic failure events associated with malfunctioning of a diagnostic measure associated with the respective component of the system. The method further includes correlating the operational failure events with the diagnostic failure events and, depending on said correlating of the operational failure events with the diagnostic failure events, identifying dormant system failure states and non-dormant system failure states of a plurality of failure states of the system.

A computer program includes program code which may be executed by at least one processor. Executing the program code by the at least one processor may cause the at least one processor to perform a method. The method includes modeling a multi-component control or actuator system using a CFT. The CFT includes a plurality of elements associated with components of the system. The CFT further includes a plurality of interconnections between the elements of the plurality of elements. The interconnections are associated with functional dependencies between the components of the system. The method further includes assigning, to at least some of the elements, operational failure events which are associated with malfunctioning of the respective component of the system. The method further includes assigning, to at least some of the elements, diagnostic failure events associated with malfunctioning of a diagnostic measure associated with the respective component of the system. The method further includes correlating the operational failure events with the diagnostic failure events and, depending on said correlating of the operational failure events with the diagnostic failure events, identifying dormant system failure states and non-dormant system failure states of a plurality of failure states of the system.

A method includes modeling a control or actuator system using a fault tree (FT). The method further includes defining operational failure events associated with malfunctioning of the system. The method further includes defining diagnostic failure events associated with malfunctioning of diagnostic measures of the system. The method further includes correlating the operational failure events with the diagnostic failure events and, depending on said correlating, identifying dormant system failure states and non-dormant system failure states of a plurality of system failure states of the system.

A device includes at least one processor. The at least one processor is configured to execute a method. The method includes modeling a control or actuator system using a fault tree (FT). The method further includes defining operational failure events associated with malfunctioning of the system. The method further includes defining diagnostic failure events associated with malfunctioning of diagnostic measures of the system. The method further includes correlating the operational failure events with the diagnostic failure events and, depending on said correlating, identifying dormant system failure states and non-dormant system failure states of a plurality of system failure states of the system.

A computer program product includes program code which may be executed by at least one processor. Executing the program code by the at least one processor may cause the at least one processor to perform a method. The method includes modeling a control or actuator system using a fault tree (FT). The method further includes defining operational failure events associated with malfunctioning of the system. The method further includes defining diagnostic failure events associated with malfunctioning of diagnostic measures of the system. The method further includes correlating the operational failure events with the diagnostic failure events and, depending on said correlating, identifying dormant system failure states and non-dormant system failure states of a plurality of system failure states of the system.

A computer program includes program code which may be executed by at least one processor. Executing the program code by the at least one processor may cause the at least one processor to perform a method. The method includes modeling a control or actuator system using a fault tree (FT). The method further includes defining operational failure events associated with malfunctioning of the system. The method further includes defining diagnostic failure events associated with malfunctioning of diagnostic measures of the system. The method further includes correlating the operational failure events with the diagnostic failure events and, depending on said correlating, identifying dormant system failure states and non-dormant system failure states of a plurality of system failure states of the system.

It is to be understood that the features mentioned above and features yet to be explained below can be used not only in the respective combinations indicated, but also in other combinations or in isolation, without departing from the scope of embodiments of the present invention. Features of the above-mentioned aspects and embodiments may be combined with each other in other embodiments.

BRIEF DESCRIPTION

Some of the embodiments will be described in detail, with reference to the following figures, wherein like designations denote like members, wherein.

DETAILED DESCRIPTION

In the following, embodiments of the invention will be described in detail with reference to the accompanying drawings. It is to be understood that the following description of embodiments is not to be taken in a limiting sense. The scope of embodiments of the invention is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Hereinafter, techniques for safety assurance are described. Safety assurance of multi-component systems such as actuator and control systems helps to increase safety in operating such systems.

Hereinafter, techniques of reliably detecting a dormant system failure state (sometimes also referred to as dormant system failure state) in a safety-critical system are described. A dormant failure state corresponds, as explained above, to a failure of the system that requires specific diagnostic actions to be identified. The dormant system failure state is a failure that is not immediately evident to operations and maintenance personnel. Dormant system failure states are, e.g., described in International Standard ISO 14224 (2006-12-15); section C.6.

Generally, the techniques described herein may find application in various kinds and types of safety-critical systems. For example, the techniques described herein may find application in multi-component control or actuator systems. Such control or actuator systems may provide control functionality or activation functionality for certain machines. Some elements of multi-component safety-critical systems may be implemented as hardware while some components may alternatively or additionally be implemented using software. It is possible that the safety-critical systems for which the techniques of detecting dormant system failure states are employed include an output which provides an actuator force or a control signal for actuating or controlling one or more machines. Specific examples of safety-critical systems which may benefit from the techniques of identifying dormant system failure states described herein include, but are not limited to: electronic circuitry including active and/or passive electronic components such as transistors, coils, capacitors, resistors, etc.; drivetrains for vehicles such as trains or passenger cars or airplanes; assembly lines including conveyor belts, robots, movable parts, control sections, test sections for inspecting manufactured goods (backend testing); medical systems such as imaging systems including magnetic resonance imaging or computer tomography, particle therapy systems; power plants; etc.

In the various examples described herein, such systems may be operated based on information derived from the safety assurance. For example, if dormant system failure states are identified, it may then be possible to define diagnostic measures to disclose the otherwise dormant system failure states and subsequently operate the system in accordance with the additionally defined diagnostic measures.

Various implementations of the techniques of detecting a dormant system failure state may rely on modeling the system using a CFT, albeit it is generally possible to use a conventional FT. For sake of simplicity, hereinafter, various examples are described in the context of CFTs—while, generally, also a FT may be employed.

CFTs are described, e.g., in Kaiser, B., Liggesmeyer, P., Mäckel, O.: A new component concept for fault trees. In: Proceedings of the 8th Australian Workshop on Safety Critical Systems and Software—Volume 33. pp. 37-46. SCS '03 (2003). CFTs provide a model- and component-based methodology for FTA, which supports a modular and compositional safety analysis strategy. The CFT includes a plurality of elements. The elements are associated with components of the system. The CFT also includes a plurality of interconnections between the elements. The interconnections are associated with functional dependencies between components of the system. Such functional dependencies may model input/output of control signals or flow of forces. The CFT may model an error behavior of the system. The error behavior of the system may be modeled by the CFT using approaches of hierarchical decomposition. Here, the overall behavior of the system can be predicted based on the individual behavior of components. In other words, the causal chain leading to an overall system behavior may be models by a causal chain of errors of components. The CFT may include Boolean links (sometimes also referred to as gates) between adjacent elements to model propagation of errors throughout the system, i.e., the interconnections. The CFT may model the system using a graph; here nodes of the graph may correspond to the elements and edges of the graph may correspond to the links.

In order to detect dormant system failure states, basic events may be provisioned in the CFT which correspond to diagnostic measures. In other words, diagnostic failure events corresponding to malfunctioning of a respective diagnostic measure may be provided. To discriminate between basic events corresponding to a component failure (operational failure events) and diagnostic failure events, a special flag or type denominator may be used in bookkeeping or when constructing the CFT graph.

For identifying a dormant system failure state, it is possible to analyze the CFT. In particular, it is possible to analyze the error propagation paths of various operational failure events. For example, a comparison between the error propagation paths of the operational failure events and the provisioned diagnostic failure events can be performed: here, it may be checked whether at least one diagnostic failure event is located along the error propagation path. This may correspond to one example of correlating the operational failure events and the diagnostic failure events. By correlating the operational failure events and the diagnostic failure events, it is possible to identify such operational failure events which have error propagation paths that are not disclosed by at least one diagnostic measure of the system. Thereby, dormant system failure states can be identified.

In some examples, analyzing the CFT may include a minimum cut set (MCS) analysis (MCA). An MCA includes determining MCSs for the various system failure states. The MCS of a system failure state is a representation of a tree using a disjunction of conjunctive terms that cannot be reduced further. In other words, the MCS of a system failure state includes all such nodes of the graph modeling the FT or CFT that must be triggered to a failure state such that the top event associated with the system failure state is also triggered to a failure state. A further reduction of the MCS is not possible, without changing the trigger state of the top event. Thus, the MCS of a system failure state identifies all events that are essential to observe the system failure state. MCS analysis is described, e.g., in: Vesely, William E., et al. FT handbook. No. NUREG-0492. Nuclear Regulatory Commission Washington D.C., 1981; section VII-15, 4 "Determining the Minimal Cut Sets or Minimal Paths Sets of a FT". An MCS may be determined manually or automatically. An exemplary technique of modeling a system using a MCS analysis is disclosed in DE 10 2015 213 581 A1.

The output of the MCS analysis, i.e., the MCS, of a system failure state t is defined as follows:

$$MCS(t) = CS_1(t) \lor \ldots \lor CS_m(t)$$

where each cut set $(CS)CS_i(t) \in \{CS_1(t), \ldots, CS_m(t)\}$ results in the occurrence of the top event $t \in CFT$, i.e., triggers the respective system failure state. Moreover, let $$CS_i(t) = b_1 \land \ldots \land b_n \text{ with } b_i \in B$$

be a CS which causes the top event t to occur, if all basic events $b_i$ of the CS are triggered. The number of elements in a CS is called the order of the CS.

By detecting dormant system failure states, it is possible to avoid hazardous situations, e.g., in an automatic manner. By detecting a dormant system failure state, it becomes possible to modify the system design, e.g., by provisioning additional diagnostic measures such that the dormant system failure state is not dormant anymore, but can rather be detected by one or more additional diagnostic measures. In some examples, it is possible to determine one more additional diagnostic measures in an automatic manner, e.g., using an optimization. Here, the position and/or account of one more diagnostic measures can be determined. It can be an optimization criterion to limit the count of diagnostic measures.

Figure 1:
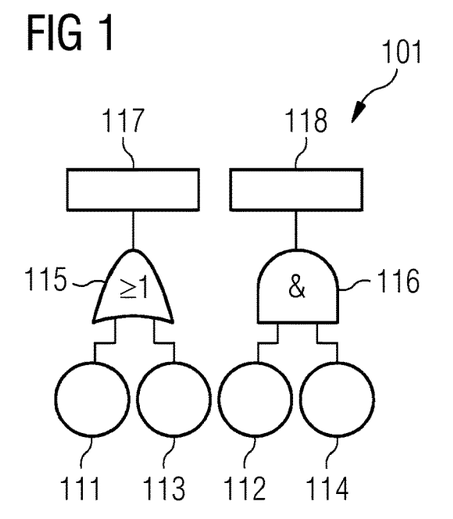
FIG. 1 schematically illustrates a FT according to embodiments of the present invention.

FIG. 1 illustrates aspects with respect to a FT 101. Details of the concept of FTs 101 are described, e.g., in Vesely, W. E., Goldberg, F. F., Roberts, N. H., Haasl, D. F.: "FT Handbook" US Nuclear Regulatory Commission (1981). The FT 101 can be used to model the failure behavior of a system in the various examples described herein. The FT, thus, may facilitate safety assurance. The failure behavior may be used in order to test whether the system may operate safely. The failure behavior may be used in order to identify drawbacks of the design of a system.

The FT 101 is represented by a graph including nodes (illustrated in FIG. 1 by the geometrical shapes) and edges (illustrated in FIG. 1 by the lines between geometrical shapes).

As illustrated in FIG. 1, the FT 101 includes basic events 111, 112, modeled by respective nodes. The basic events may correspond to operational failure events. An operational failure event may correspond to some defect of the operation of the system which is modeled by the FT 101. For example, an operational failure event may correspond to the malfunctioning of an electronic components such as a resistors or a switch. For example, an operational failure event may correspond to the malfunctioning of a valve such as a pressure release valve, etc. For example, an operational failure event may correspond to malfunctioning of a cooling system. There are numerous possibilities of the kind and type of malfunction modeled by the operational failure event; the given examples are only illustrative examples and a wide variety of different kinds and types of operational failure events are conceivable.

The FT 101 also includes input ports 113, 114. The input ports 113, 114 may receive a failure state from one or more further nodes (not illustrated in FIG. 1).

The FT 101 also includes Boolean operators 115, 116. Boolean operator 115 is implemented as a logical OR combination of the states of the operational failure event 111 and the input port 113; while Boolean operator 116 is implemented as a logical AND combination of the states of the operational failure event 112 and the input port 114. Besides AND and OR operations, other operations are possible such as NAND or XOR.

Thus, based on the FT 101, it is possible to model the error propagation path of a failure event, e.g., of the operational failure events 111 and 112. In particular, it can be checked whether the error propagation path of the failure event influences the state of one or more top ports 117, 118.

In FIG. 1, the FT 101 is defined independently of the various components of the system. In other examples, it is possible to define FTs where individual elements and interconnections of the FT are associated with one or more components of the modeled system, i.e., to use a CFT. Such a CFT is illustrated in FIG. 2.

Figure 2:
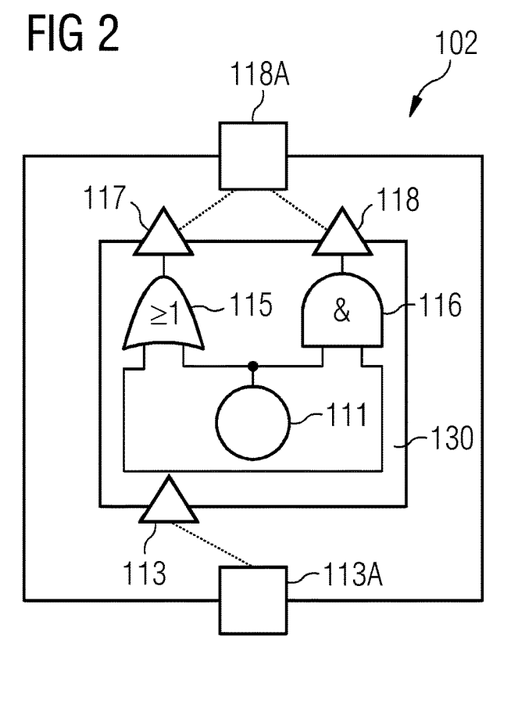
FIG. 2 schematically illustrates a CFT according to embodiments of the present invention.

FIG. 2 illustrates aspects with respect to a CFT 102. The CFT 102—in a manner comparable to the FT 101—is represented by a graph including nodes (illustrated in FIG. 2 by the geometrical shapes) and edges (illustrated in FIG. 1 by the lines between geometrical shapes).

Again, the CFT includes an operational failure event 111, input ports 113, 113A, Boolean operators 115, 116, and top ports 117, 118, 118A. In the example of FIG. 2, the entire CFT 102 is associated with a single element 130; the element 130 corresponds to a component of the system. Hence, a mapping is provided between different nodes and interconnections of the graph implementing the CFT 102 on the one hand side, and the various components of the system (in FIG. 2, for sake of simplicity, only a single component is represented by the element 130, albeit generally multiple components may be modeled by multiple elements).

Such a mapping between different nodes and interconnections of the graph implementing the CFT 102 on the one hand side, and the various components of the system on the other hand side enables to model internal operational failure states associated with components of the system and to analyze the error propagation path of an operational failure state throughout the system on component level. This facilitates predicting whether certain components of the system will be affected by a system failure state. Generally, the CFT enables to associate specific top events to the corresponding ports where the failures can appear. For example, in FIG. 2, the operational failure event associated with the top port 117 will appear on system level at port 118A. This facilitates increased maintainability of the safety analysis model.

Generally, a CFT 102 may be transformed to a classic FT 101—and vice versa. This may be done by removing the various elements 130 and any duplicate ports such as the top port 118A and the input port 113A in the example of FIG. 2.

Figure 3:
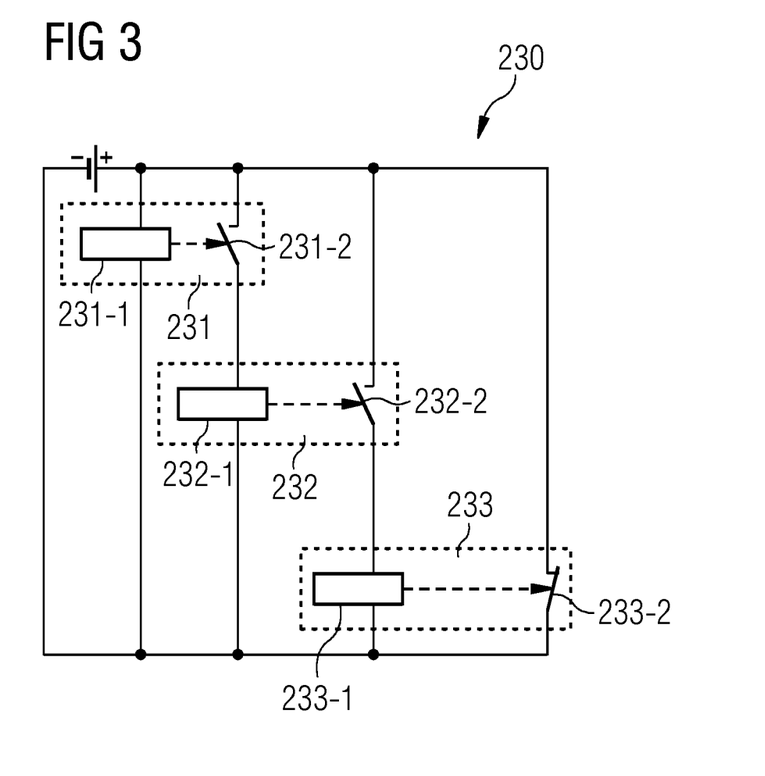
FIG. 3 schematically illustrates a multi-component system according to embodiments of the present invention.

FIG. 3 illustrates aspects with respect to a multi-component control or actuator system 230. In the example of FIG. 3, the system 230 includes a plurality of components 231-233 in the form of switches or relays. Also illustrated are actuators 231-1, 232-1, 233-1 for the switches 231-233 and switching elements 231-2, 232-2, 233-2. The switches 231-233 are arranged in a cascaded manner such that, e.g., upon closing switching element 231-2 switch 232 is actuated. For example, the switches 231-233 could be implemented by transistors or relays. The switches 231, 232 may be normally opened; while the switch 233 may be normally closed. FIG. 3 is a circuit diagram of the system 230.

Due to the cascaded arrangement of the switches 231-233, a failure of, e.g., the switch 232, will also affect the operation of switch 233.

Figure 4:
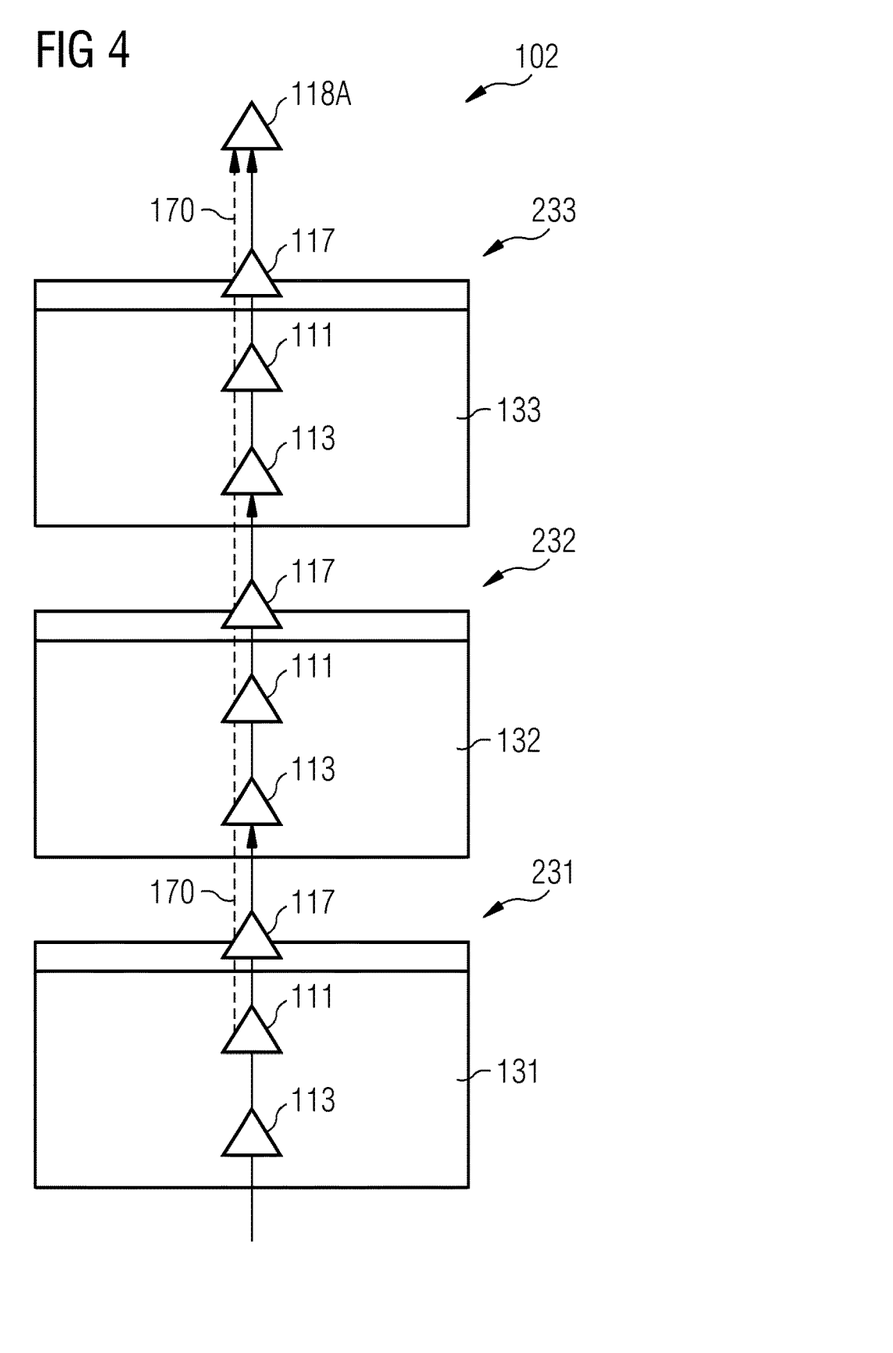
FIG. 4 schematically illustrates a CFT of the multi-component system of FIG. 3 according to embodiments of the present invention.

FIG. 4 illustrates aspects with respect to a CFT 102. In particular, FIG. 4 illustrates the CFT 102 which models the system 230 according to FIG. 3. The CFT 102 includes elements 131-133 corresponding to the components 231-233, i.e., the switches in the example of FIGS. 3 and 4. Each element 131-133 has an input port 113 and a top port 117. Furthermore, each element 131-133 is associated with an operational failure event 111. The operational failure events 111 correspond to malfunctioning of the respective component 231-233.

A system failure state is characterized by the participating operational failure events and the associated error propagation path. For example, different system failure states may be associated with different top events: top event 118A may correspond to a given system failure state of a plurality of system failure states. In the example of FIG. 4, the system failure state of the top event 118A may be triggered by any one of the operational failure events 111 of the elements 131-133. For exemplary purposes, the error propagation path 170 associated with the operational failure event 111 of the element 131 is illustrated in FIG. 4 (dashed line in FIG. 4).

In some examples, the CFT 102 may be generated automatically based on the circuit diagram of the system 230. Generally, the circuit diagram includes interconnected electrical components (such as the switches 231-233 in the example of FIG. 3). And, thus, it is possible to automatically extract the information to create the CFT 102 to appropriately model the system 230. Example techniques of modeling the system 230 by means of the CFT 102 are described in Zeller, M., Höfig, K.: INSiDER: "Incorporation of system and safety analysis models using a dedicated reference model." 2016 Annual Reliability and Maintainability Symposium (RAMS) (2016) pp. 1-6. Thereby, for each component/switch 231-233 of the system 230, an element 131-133 is created in the CFT 102. The interconnections of the CFT 102 follow the electrical traces of the circuit diagram. See Möhrle, F., Zeller, M., Hfig, K., Rothfelder, M., Liggesmeyer, P.: "Automating compositional safety analysis using a failure type taxonomy for CFTs." Walls, L., Revie, M., Bedford, T. (eds.) Risk, Reliability and Safety: Innovating Theory and Practice: Proceedings of ESREL 2016. pp. 1380-1387 (2016). Thereby, the CFT 102 may be determined fully automatically, e.g., if the elements 131-133 are predefined for each type of electronic component within the system 230.

According to examples, it is possible to assign to at least some of the elements of a CFT, diagnostic failure events. The diagnostic failure events are associated with the respective component of the system and model malfunctioning of a diagnostic measure which is able to detect malfunctioning of the component. In other words, the diagnostic failure events can model malfunctioning of a diagnostic measure which is able to detect an operational failure event of the respective component.

Figure 5:
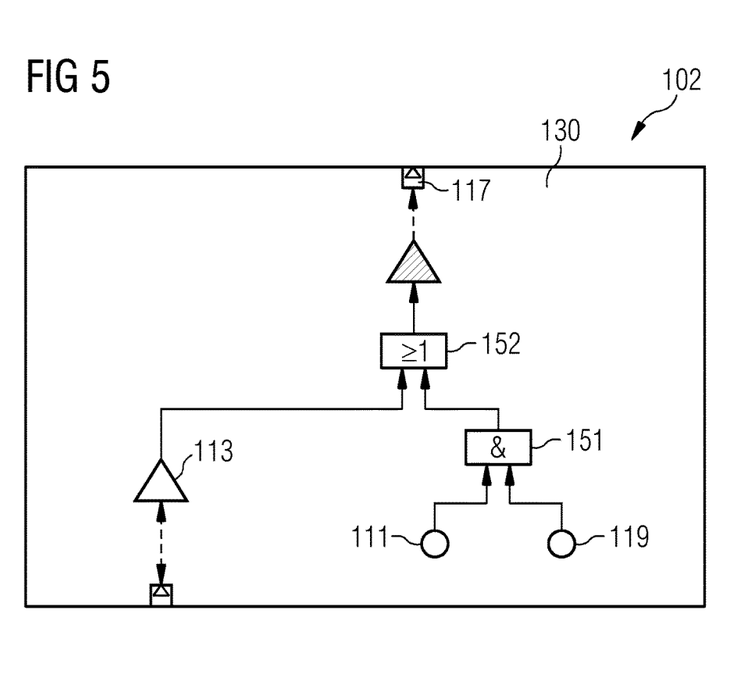
FIG. 5 schematically illustrates a diagnostic failure event according to embodiments of the present invention.

FIG. 5 illustrates aspects with respect to a diagnostic failure event 119. The diagnostic failure event 119 is assigned to the element 130 of the CFT 102 (in FIG. 5, further details of the CFT 102 beyond the element 130 are omitted for sake of simplicity).

In the example of FIG. 5, the diagnostic failure event 119 is arranged on the same level of hierarchy as the operational failure event 111 associated with malfunctioning of the component of the system modeled by the element 130. A Boolean AND operator 151 combines the states of the operational failure event 111 and the diagnostic failure event 119. Then, a Boolean OR operator 152 combines the states of the output of the Boolean OR operator 151 and the input port 113. Hence, the top port 117 is indicative of a system error state if (I) the input port 113 is indicative of a system error state, and/or (II) if both failure events 111, 119 are triggered.

In the example of FIG. 5, the diagnostic measure modeled by the diagnostic failure event 119 is not able to detect a system failure state having a propagation path along the input port 113. In other examples, however, it would be possible that the diagnostic measure modeled by the respective diagnostic failure event is able to detect such a system failure state having a propagation path along the input port 113. Here, a Boolean AND operator may be employed for combining the states of the respective operational failure event and the input port 113.

As will be appreciated from the description of FIGS. 2-5, it is possible to model a controller or actuator system using a CFT which includes a plurality of elements and a plurality of interconnections between the elements. Operational failure events may be assigned to at least some elements of the plurality of elements. The operational failure events are associated with malfunctioning of the respective component of the system. Further, diagnostic failure events associated with malfunctioning of a diagnostic measure associated with the respective component of the system are assigned to at least some elements of the plurality of elements. Based on a CFT having such a structure, it is then possible to reliably detect system failure states, including dormant system failure states and non-dormant system failure states. For this, and appropriately configured device may be employed.

Figure 6:
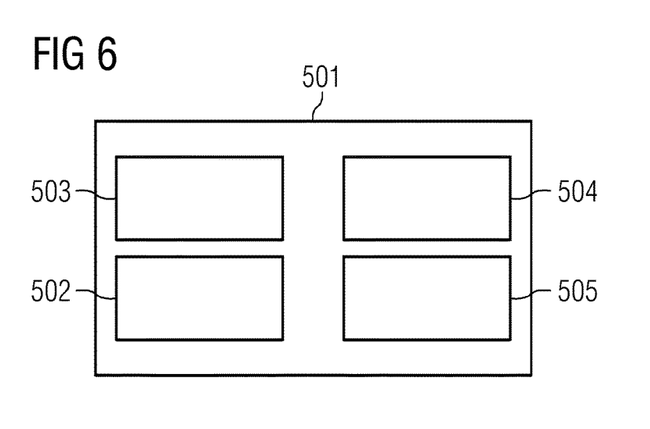
FIG. 6 schematically illustrates a device according to embodiments of the present invention.

FIG. 6 illustrates aspects with respect to the device 501. The device 501 includes a human machine interface (HMI) 502. For example, the HMI may be configured to receive information from a user and/or to output information to a user. For example, the HMI may include one or more of the following: a keyboard; a mouse; loudspeakers; voice control; a monitor; etc. The HMI 502 is optional.

The device 501 further includes a processor 503, e.g., a multicore processor. The processor 503 is configured to receive program code from a memory 504, e.g., a non-volatile memory. The processor 503 is configured to execute the program code. Executing the program code can cause the processor 503 to perform techniques as described herein, e.g., with respect to: modeling a multi-component control or actuator system using a FT, e.g., a CFT; assigning operational failure events and/or diagnostic failure events to certain positions or elements of the FT such as the CFT; correlating the operational failure events with the diagnostic failure events to identify dormant system failure states and non-dormant system failure states; performing a MCA of the FT such as the CFT; determining an error propagation path of a system failure state through the FT such as the CFT; etc.

The device 501 further includes an interface 505. For example, control data may be output via the interface 505. For example, it may be possible to control the operation of a multi-component control or actuator system by means of control data which is transmitted via the interface 505. The interface 505 is optional.

Figure 7:
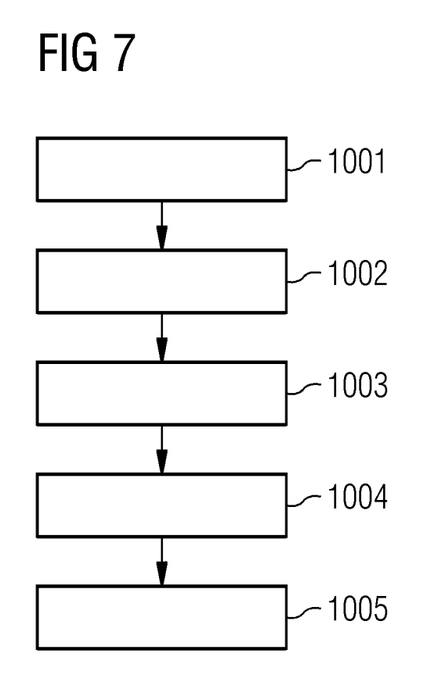
FIG. 7 is a flowchart of a method according to embodiments of the present invention.

FIG. 7 is a flowchart of a method according to various examples. For example, the method according to the flowchart of FIG. 7 may be executed by the processor 503 of the device 501.

In box 1001, a system-such as a multi-component control or actuator system or another type of system which includes hardware and/or software components—is modeled using a FT, such as a CFT. The FT, such as the CFT, may be defined by a graph including nodes and edges. Some of the nodes may correspond to basic events of the FT, such as the CFT.

In particular, in box 1002, operational failure events associated with malfunctioning of one or more components of the system are defined within the FT, such as the CFT. This may include assigning operational failure events to at least some elements of a plurality of elements of the CFT.

In box 1003, diagnostic failure events associated with malfunctioning of a diagnostic measure are defined. For example, the diagnostic measures may be associated with respective components of the system. As such, box 1003 may include assigning the diagnostic failure events to at least some elements of a plurality of elements of the CFT.

Then, in box 1004, the operational failure events are correlated with the diagnostic failure events. This allows to identify dormant system failure states in box 1005 based on said correlating.

The correlation of the operational failure events with the diagnostic failure events may include analyzing error propagation paths of the various operational failure events. An error propagation path of the given operational failure event may be associated with a top event which, in turn, is characteristic for the respective system failure state. By analyzing the error propagation path of the given operational failure event, e.g., all the way up to the corresponding top event, it can be checked whether there is at least one diagnostic measure that is suited for detecting the respective system failure state; depending on such a check, it is possible to discriminate dormant system failure states and non-dormant system failure states. For example, it could be checked whether one or more diagnostic failure events are located along the error propagation path of the given operational failure event. In the affirmative, it can be judged that the respective system failure state is not dormant, because it can be normally detected by the diagnostic measures associated with them one or more diagnostic failure events which are situated along the error propagation path. Here, the likelihood of malfunctioning of the respective diagnostic measure—i.e., the likelihood of the diagnostic failure event triggering in a failure state—is comparably low such that it may be assumed that the system failure state can be reliably disclosed.

Such an analysis can be facilitated by considering a MCA. In particular, the correlating in box 1004 may be based on a MCA of the CFT. Sometimes, the MCSs may be determined for all system failure states, i.e., for all top events; sometimes, a subset of top events subject to MCS analysis may be selected, e.g., manually.

Each basic event of a CFT either re-presents malfunctioning of the respective component of the system, i.e., is an operational failure event, or represents malfunctioning of a diagnostic measure associated with the respective component, i.e., is a diagnostic failure event. Hence, each cut set (CS) obtained from the MCA which does not include any diagnostic failure events re-presents a dormant system failure state which triggers a top event without the possibility of detecting by means of an appropriate diagnostic measure. Hence, it would be possible to determine a MCS of each system failure state and determine a number of diagnostic failure events included in the MCS. Then, based on the determined number of diagnostic failure events included in the respective MCS, it is possible to identify the respective system failure state as a dormant system failure state or as a non-dormant system failure state. Again, a likelihood of failure of one or more diagnostic actions modeled by the diagnostic failure events in the MCS may or may not be taken into account when labeling the associated system failure state as dormant or non-dormant. For example, all MCS having at least one or at least two or at least three diagnostic failure events could define non-dormant system failure states.

Especially, the CSs having order equal to 1 and only containing a single operational failure event are to be investigated more closely. This is because such CSs having order equal to 1 resemble single points of failure. Here, it should be noted that the Boolean AND operator used for combining the states of a diagnostic failure event and an operational failure event (cf. FIG. 5) result in CSs including at least one diagnostic failure event necessarily being of order two (or higher). Also redundancy mechanism-represented in the CFT/FT typically by an AND gate—introduced in the system such as an electric circuit lead to CSs of the order of 2 or higher. Where the redundancy is represented by a Boolean AND operator, the thus connected redundant parts must fail in order to propagate a failure. This results in a CS of higher order since an AND Boolean operator increases the order of a cut set compared to a single part represented without an AND Boolean operator.

Various techniques described herein are based on the finding that it is not required that each component of a multi-component system is provided with a diagnostic measure in order to avoid dormant system failure states. For example, in case of an electric circuit, it is not required that each electric component having the potential of malfunctioning and, thus, being associated with an operational failure event in the respective CFT, has a dedicated diagnostic measure. For example, if the set of switches is wired in series (cf. FIGS. 3 and 4), it is sufficient if the last switch of this series is provided with a diagnostic measure in order to disclose the error propagation paths of all operational failure events in the chain and, thereby, prevent dormant system failure states. In other words, based on a correlation of the operational failure events with the diagnostic failure events—e.g., by checking the error propagation paths of the various system failure states—, it becomes possible to identify redundant diagnostic measures of the system associated with the same non-dormant system failure state. Then it would be possible to simplify the system by removing the corresponding diagnostic measures. In some examples, this could be achieved by determining a MCS of the respective system failure state using an MCA and determining a number of diagnostic failure events included in the MCS. Based on the determined number of diagnostic failure events included in the respective MCS, it is then possible to identify redundant diagnostic measures of the system associated with the same system failure state. For example, the MCS includes a plurality of diagnostic failure events, it can be judged that the at least some of these diagnostic failure events are redundant such that the associated diagnostic measures could be removed from the system.

Thus, on the other hand, it is possible determine candidate positions for one or more further diagnostic measures to be added to the system. A candidate positions can be located along the error propagation path of an otherwise dormant system failure state. Here, it would be possible that the candidate positions are determined using an optimization. The count of the one or more further diagnostic measures can be considered as an optimization criterion of the optimization. For example, there could be a tendency to minimize the count of the one or more further diagnostic measures required to unambiguously detect an otherwise dormant system failure state. In other words, it is possible that the set of diagnostic measures is optimized based on the CFT which also includes the respective diagnostic failure events and, thereby, models the error propagation paths of the various system failure states.

Figure 8:
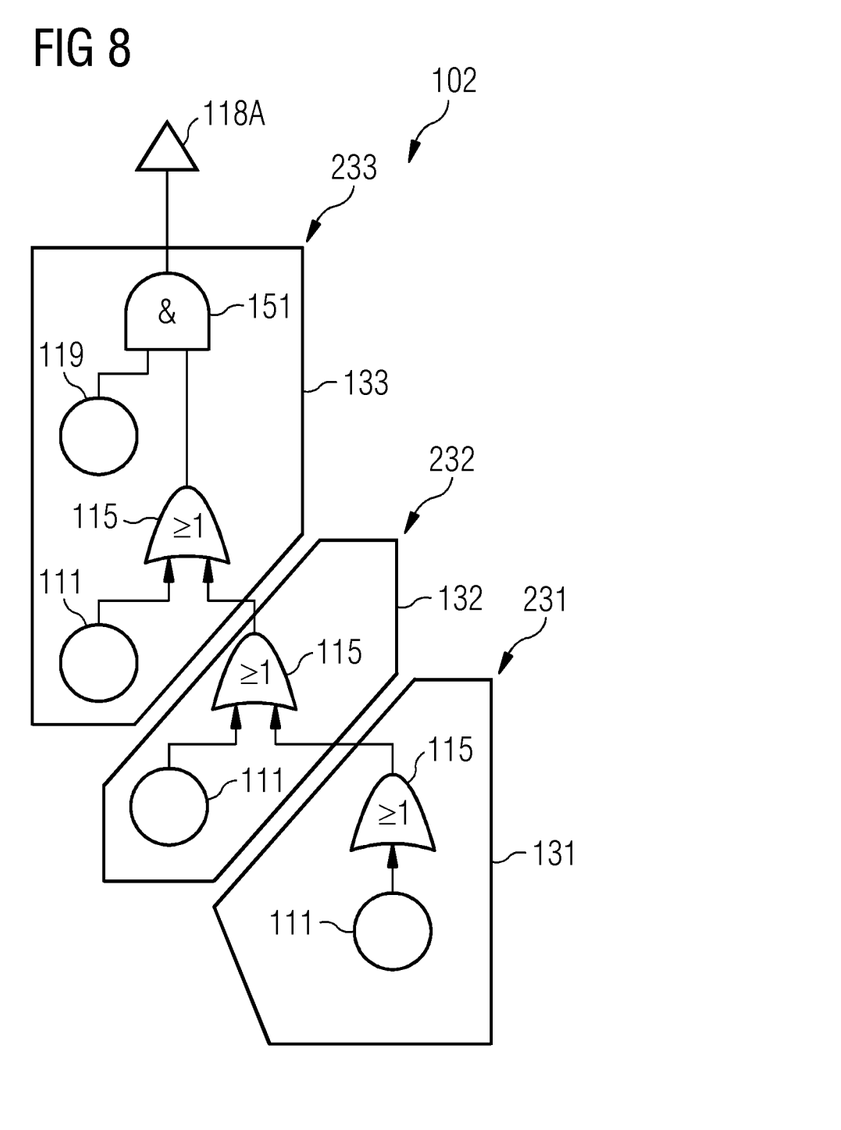
FIG. 8 schematically illustrates a CFT according to embodiments of the present invention.

FIG. 8 schematically illustrates aspects with respect to a CFT 102. The CFT 102 of the example of FIG. 8 models the electronic system 230 according to the example of FIG. 3. FIG. 8 further schematically illustrates aspects with respect to a dedicated, further diagnostic measure associated with the component 233 and, thus, a respective diagnostic failure event 119 being included in the element 133.

Without the additional diagnostic failure event 119 being included, the MCS associated with the system failure state of the top event 118A is given by:

$$MCS(\text{top event}) = CS_1(\text{top event}) \lor CS_2(\text{top event}) \lor CS_3(\text{top event})$$

with a total number of three CSs:

$$CS_{131}(\text{top event}) = NC_{131}$$

$$CS_{132}(\text{top event}) = NC_{132}$$

$$CS_{133}(\text{top event}) = NC_{133}$$

Here, CS131 corresponds to the operational failure event 111 of the element 131 associated with a normally-opened switch 231; CS132 corresponds to the operational failure event 111 of the element 132 associated with a normally-opened switch 232; and CS133 corresponds to the operational failure event 111 of the element 133 associated with a normally-closed switch 233.

Each of those CSs as the order of 1. Hence, without the diagnostic measure associated with the diagnostic failure event 119, each of the CSs results in a dormant system failure state, since no diagnostic failure events are included in the respective CSs. Thus, the associated top event 118A is potentially hazardous. Providing the appropriate diagnostic measure can be achieved by means of the optimization or another appropriate algorithm. For example, provisioning a respective diagnostic measure for each one of the components 231-233 would create redundancy. Based on the results of the MCS analysis and the information on the structure of the underlying system 230, it is possible to order the CSs according to the architecture of the system 230— i.e., according to the arrangement of the components in the system—as follows:

$$CS_{131} \rightarrow CS_{132} \rightarrow CS_{133}$$

As illustrated in FIG. 8, due to the serial architecture of the system 230, it is required to provide the diagnostic measure only with respect to the last component 233 of the series. The corresponding diagnostic measure can reveal all error propagation paths associated with the operational failure events 111 of the elements 131-133. This is achieved by the diagnostic failure event 119 and the Boolean AND operator 151.

Summarizing, above, techniques have been described which enable to identify dormant system failure states in systems such as multi-component controller actuator systems. Generally, any system that can be modeled by a dependency graph using a FT or a CFT can be subject to the techniques described herein. Dormant system failure states can be identified reliably.

According to examples, the techniques rely on a CFT. Here, the CFT can be generated automatically based on knowledge on the architecture of the system, in particular, if the system is an electronic circuit including multiple electronic components. Such an approach offers the possibility of repeating analysis of the CFT each time the system is modified. Thus, the manual, time-consuming and error-prone task of assessing the system to identify dormant system failure states according to reference techniques can be implemented automatically, thereby, reducing the risk for oversights, etc.

Alternatively or additionally to identifying dormant system failure states, it is also possible to identify missing or redundant diagnostic measures. The number of diagnostic measures can be optimized, because it is possible to determine the required set of diagnostic measurements to avoid any dormant system failure states.

The techniques described herein can further facilitate finding the root cause after a failure occurs in the system. This is possible, since the results of the analysis may reveal a set of possible operational failure events that are disclosed by an associated diagnostic measure.

For illustration, while above various examples have been described in connection with a CFT, the CFT is not germane for the functioning of the described techniques. The various examples may also be implemented using an ordinary FT. Here, it may not be required to discriminate between different components with which certain diagnostic failure events are associated. Rather, the diagnostic failure events may be embedded into the architecture of the FT depending on their logical arrangement in the modeled system.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A computer-implemented method, comprising:
    modeling a multi-component control or actuator system using a component fault tree, the component fault tree comprising a plurality of elements associated with components of the multi-component control or actuator system and a plurality of interconnections between elements of the plurality of elements associated with functional dependencies between the components of the multi-component control or actuator system;
    assigning, to at least some elements of the plurality of elements, operational failure events associated with malfunctioning of the respective component of the multi-component control or actuator system;
    assigning, to at least some elements of the plurality of elements, diagnostic failure events associated with malfunctioning of a diagnostic measure associated with the respective component of the multi-component control or actuator system;

correlating the operational failure events with the diagnostic failure events; and depending on the correlating, identifying dormant system failure states and non-dormant system failure states of a plurality of system failure states of the multi-component control or actuator system.

2. The method of claim 1, wherein the correlating is based on a minimum cut set analysis of the component fault tree.

3. The method of claim 1, wherein said correlating comprises:

for each operational failure event: determining an error propagation path of an associated system failure state through the component fault tree, and checking if at least one diagnostic failure event is located along the error propagation path.

4. The method of claim 1, wherein the correlating comprises:

for each system failure state of the plurality of system failure state: determining a minimum cut set of the respective system failure state using a minimum cut set analysis and determining a number of diagnostic failure events included in the minimum cut set, and for each system failure state of the plurality of system failure state: based on the determined number of diagnostic failure events included in the respective minimum cut set, identifying the respective system failure state as a dormant system failure state or as a non-dormant system failure state.

5. The method of any claim 1, further comprising:

depending on the correlating, identifying redundant diagnostic measures of the multi-component control or actuator system associated with the same non-dormant system failure state.

6. The method of claim 1, further comprising:

for each system failure state of the plurality of system failure state: determining a minimum cut set of the respective system failure state using a minimum cut set analysis and determining a number of diagnostic failure events included in the minimum cut set, and for each system failure state of the plurality of system failure state: based on the determined number of diagnostic failure events included in the respective minimum cut set, identifying redundant diagnostic measures of the multi-component control or actuator system associated with the same system failure state.

7. The method of claim 1, further comprising:

for at least some of the identified dormant system failure states: determining candidate positions for at least one further diagnostic measure along an error propagation path of an operational failure event of a dormant system failure state.

8. The method of claim 7, wherein the candidate positions for the at least one further diagnostic measure are determined using an optimization, a count of the at least one further diagnostic measure being an optimization criterion of the optimization.

9. A device comprising at least one processor configured to:

model a multi-component control or actuator system using a component fault tree, the component fault tree comprising a plurality of elements associated with components of the multi-component control or actuator system and a plurality of interconnections between elements of the plurality of elements associated with functional dependencies between the components of the multi-component control or actuator system;

assign, to at least some elements of the plurality of elements, operational failure events associated with malfunctioning of the respective component of the system;

assign, to at least some elements of the plurality of elements, diagnostic failure events associated with malfunctioning of a diagnostic measure associated with the respective component of the multi-component control or actuator system;

correlate the operational failure events with the diagnostic failure events; and depending on the correlating, identify dormant system failure states and non-dormant system failure states of a plurality of system failure states of the multi-component control or actuator system.

10. The device of claim 9, wherein the at least one processor is further configured to perform the method according to claim 1.

11. A method comprising:

modeling a control or actuator system using a fault tree;

defining operational failure events associated with malfunctioning of the a control or actuator system;

defining diagnostic failure events associated with malfunctioning of diagnostic measures of the a control or actuator system;

correlating the operational failure events with the diagnostic failure events; and depending on the correlating, identifying dormant system failure states and non-dormant system failure states of a plurality of system failure states of the a control or actuator system.

\* \* \* \* \*